(12) United States Patent
Kino et al.

(10) Patent No.: US 6,982,841 B2
(45) Date of Patent: Jan. 3, 2006

(54) MIRROR HOLDING MECHANISM IN EXPOSURE APPARATUS, AND DEVICE MANUFACTURING METHOD

(75) Inventors: Yoshiki Kino, Utsunomiya (JP); Yoshinori Miwa, Utsunomiya (JP); Masanori Honda, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 67 days.

(21) Appl. No.: 10/778,810

(22) Filed: Feb. 13, 2004

(65) Prior Publication Data

US 2004/0218289 A1    Nov. 4, 2004

(30) Foreign Application Priority Data

Feb. 13, 2003    (JP) .............................. 2003-035271

(51) Int. Cl.
*G02B 7/02* (2006.01)
*G02B 7/182* (2006.01)
*G03B 21/14* (2006.01)

(52) U.S. Cl. ..................... 359/822; 359/818; 359/872; 353/100

(58) Field of Classification Search ................ 359/811, 359/813, 822, 823, 699, 872; 353/100
See application file for complete search history.

(56) References Cited

U.S. PATENT DOCUMENTS 6,631,035 B2 * 10/2003 Iikawa et al. ............... 359/699

FOREIGN PATENT DOCUMENTS

JP          3359330        11/1993

* cited by examiner

Primary Examiner—Georgia Epps
Assistant Examiner—Jack Dinh
(74) Attorney, Agent, or Firm—Morgan & Finnegan, L.L.P.

(57) ABSTRACT

Disclosed is a mirror holding system by which aberration resulting from deformation or positional deviation of an optical member, causing degradation of imaging performance, can be reduced whereby a desired optical performance is assured. Also disclosed is an exposure apparatus and a device manufacturing method based on such mirror holding system. The holding system includes a supporting member for supporting the optical element at a plurality of supports which are movable along an approximately radial direction about a predetermined point.

25 Claims, 6 Drawing Sheets

MIRROR HOLDING MECHANISM IN EXPOSURE APPARATUS, AND DEVICE MANUFACTURING METHOD

FIELD OF THE INVENTION AND RELATED ART

This invention relates generally to a precision instrument on which an optical member is mounted and, more particularly, to a projection optical system for use in an exposure apparatus, for example. Specifically, the invention concerns a holding system for an optical member, usable in an exposure apparatus for lithographic procedure for manufacture of semiconductor devices, image pickup devices such as CCD, or thin-film magnetic heads, for example, to obtain a more exact imaging relationship in projection exposure in which an image of an original such as mask or reticle (these terms being used alternately in this specification) is projected upon a workpiece to be processed.

Manufacture of devices based on photolithographic (printing) technology uses a reduction projection exposure apparatus wherein a circuit pattern formed on a mask is transferred onto a workpiece such as a wafer, through a projection optical system. The projection optical system images diffraction light from the circuit pattern upon the wafer, based on interference.

In order to meet requirements to further reduction in size and thickness of electronic instruments, devices to be mounted on the electronic instruments must be largely integrated. Thus, further miniaturization of a circuit pattern to be transferred, in other words, improvements of resolution, has been required more and more. In order to obtain a higher resolving power, the wavelength of exposure light should be shortened and, additionally, the numerical aperture (NA) of the projection lens should be enlarged. Simultaneously, aberration of the projection optical system has to be suppressed to a very low level.

If deformation occurs in an optical element such as lens or mirror, constituting the projection optical system, the light path inflects before and after the deformation so that light rays that should be imaged upon a single point do not converge at that point, causing aberration. Such aberration produces a positional deviation that may result in short-circuit in a circuit pattern formed on a wafer. If, on the other hand, the pattern size is widened to avoid short-circuit, it directly contradicts to the requirement of miniaturization.

Thus, in order to accomplish a projection optical system having small aberration, it is very important to hold optical elements, constituting the projection optical system, within the projection optical system without changing the shape thereof and the position thereof with respect to the optical axis, thereby to ensure that inherent optical performance of the optical elements is best presented. Particularly, because of enlargement of NA of recent projection optical systems, current projection lenses have a large diameter. The lens volume is thus large and, as a result, deformation due to self weight easily occurs. Further, in exposure apparatuses that use extreme ultraviolet (EUV) light (hereinafter, "EUV exposure apparatus"), the projection optical system has to be constituted by a small number of reflecting elements (i.e. mirrors) because of its shortness of the wavelength (wavelength is about 10 to 15 nm order). Thus, the precision required for the mirror shape and positional precision with respect to the optical axis are extraordinarily strict.

An example of a method of holding an optical element without causing deformation thereof, is a mask holding method (Registered Japanese Patent No. 3359330). In this method, a cone, a V-shaped groove and a plane are used and, by fixing the mask as like kinematic, the mask can be held without deformation of the mask surface.

Since EUV exposure apparatuses are used for exposure of a circuit pattern of a linewidth of 0.1 micron or less, the linewidth precision is very strict. Regarding the mirror shape, only a deformation of about 1 nm or less may be tolerable. It is therefore necessary to reproduce the mirror shape, determined when it was machined, at the time when the same is incorporated into an EUV exposure apparatus.

However, the base material constituting the mirror is very soft, and only a force (holding force) applied by a holding member for holding the mirror will be sufficient to produce deformation of a few nanometers in the mirror. Also, thermal expansion, vibration or deformation of the holding member may cause a positional deviation of the mirror. Furthermore, a mirror does not reflect all the exposure light, but it absorbs 30% or more of the exposure light. The absorbed exposure light produces heat that causes thermal expansion of the mirror and it changes the mirror shape and the mirror position with respect to the optical axis.

For theses reasons, it is very difficult to hold a mirror within a projection optical system without a change in mirror shape or in mirror position with respect to the optical axis, to ensure desired optical performance.

It is accordingly an object of the present invention to provide a holding system by which aberration resulting from deformation or positional deviation of an optical member, causing degradation of imaging performance, can be reduced whereby a desired optical performance is assured.

It is another object of the present invention to provide an exposure apparatus and/or a device manufacturing method, based on such holding system.

In accordance with an aspect of the present invention, there is provided a holding system, comprising: a supporting member for supporting an optical element approximately at six points through three first spherical members, wherein said supporting member has three grooves each extending in an approximately radial direction about a predetermined point, wherein the three grooves and the three first spherical members are engaged with each other to position the optical element, and wherein each of the three grooves is movable in the approximately radiation direction.

In one preferred form of this aspect of the present invention, the three grooves are coupled to a fixing member through an elastic member and, through elastic deformation of the elastic member in the approximately radial direction, the three grooves can move.

The elastic member may be a resilient hinge.

The elastic member may be a leaf spring, wherein a direction normal to the surface of the leaf spring may be substantially parallel to the approximately radial direction.

Elastic deformation of the elastic member may occur substantially only in the approximately radial direction.

The holding system may further comprise an elastic supporting member for applying an elastic force to the optical element in a direction pressing the optical element against the first spherical member, wherein the elastic supporting member may be fixed to the fixing member.

The holding system may further comprise an elastic supporting member for applying an elastic force to the optical element in a direction pressing the optical element against the first spherical member.

The portion of the elastic supporting member that applies a force in a direction pressing the optical element against the first spherical member, may be made movable in the approximately radial direction.

The elastic supporting member may apply a force to the optical element through a second spherical member.

The elastic supporting member and the second spherical member may engage with each other substantially at a single point.

The holding system may further comprise an intermediate supporting member being provided integrally with the optical element or being arranged to support the optical element, wherein the intermediate supporting member may have three first recessed portions, the three first recessed portions and the three first spherical members engage with each other at three or more points, or they engage with each other linearly, and wherein, at contact points between the three first recessed portions and the three first spherical members, the first recessed portions may have a side-face shape of pyramid or cone.

The first recessed portions may have a shape of one cone, pyramid, truncated cone and truncated pyramid.

The holding system may further comprise a second intermediate supporting member being provided integrally with the optical element or being provided on the optical element or being arranged to support the optical element, said second intermediate supporting member having three second recessed portions and three second spherical members corresponding to the three second recessed portions, respectively, wherein each of the second recessed portions may engage with a second spherical member at three or more points or they engage with each other substantially linearly, and wherein a force that the second spherical member applies to the second recessed portion and a force that the first spherical member applies to the second recessed portion may be substantially in opposite directions.

The intermediate supporting member may be provided by a portion of the optical element.

The intermediate supporting member may be a supporting frame, a relative position of which with reference to the optical element may be substantially unchangeable.

The holding system may further comprise a coupling member for connecting the optical element and the supporting member through the spherical member.

The coupling member may be a resilient hinge.

The three grooves may be disposed to define, therebetween, an angle not less than 90 deg. and not greater than 160 deg.

The three grooves may be disposed to define, therebetween, an angle not less than 110 deg. and not greater than 130 deg.

The three grooves may have a V-shape in cross-section, contacting the three first spherical members approximately at two points.

The optical element may be a reflection member.

In accordance with another aspect of the present invention, there is provided an exposure apparatus, comprising: an illumination optical system for illuminating a pattern, formed on a mask or a reticle, with light from a light source; a projection optical system for projecting light from the pattern to a workpiece to be exposed; and a holding system as recited in claim 1, wherein at least one of said illumination optical system and said projection optical system includes said holding system.

In one preferred form of this aspect of the present invention, light used in said apparatus may be extreme ultraviolet light.

In said exposure apparatus, an ambience of a light path along which exposure light passes may be filled with a high vacuum or substantially filled with a helium gas.

In accordance with a further aspect of the present invention, there is provided a device manufacturing method, comprising the steps of: exposing a workpiece to be exposed, by use of an exposure apparatus as recited in above; and performing a predetermined process to the exposed workpiece.

In accordance with a yet further aspect of the present invention, there is provided a holding system, comprising: a supporting member for supporting an optical element by means of a plurality of supports; wherein said plurality of supports are movable in an approximately radial direction about a predetermined point.

In accordance with a still further aspect of the present invention, there is provided an exposure apparatus, comprising: an illumination optical system for illuminating a pattern, formed on a mask or a reticle, with light from a light source; a projection optical system for projecting light from the pattern to a workpiece to be exposed; and a holding system as recited above, wherein at least one of said illumination optical system and said projection optical system includes said holding system.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
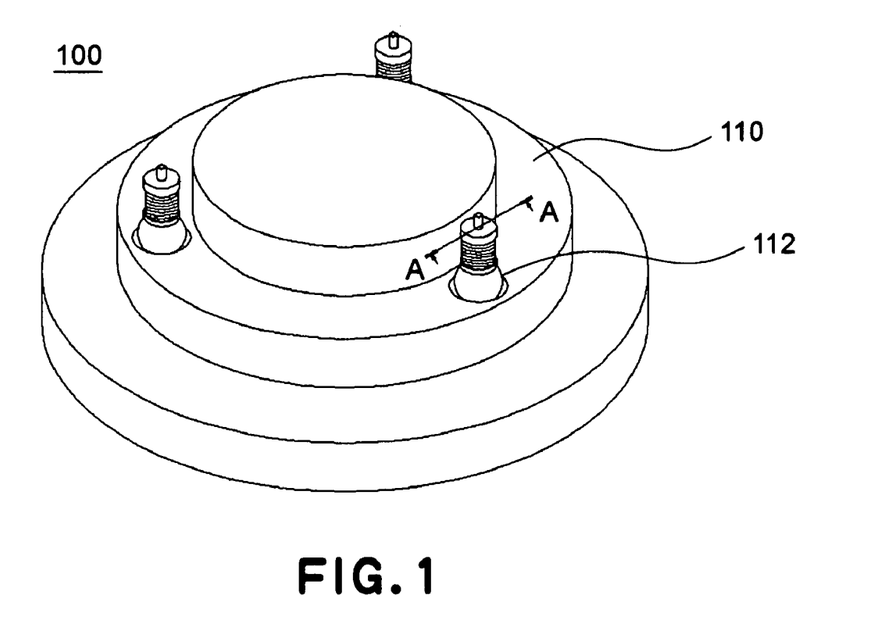
FIG. 1 is a schematic and perspective view for explaining a mirror holding method according to an embodiment of the present invention.

Preferred embodiments of mirror holding method and exposure apparatus according to the present invention will now be described with reference to the attached drawings. However, the invention is not limited to these embodiments, and components may be replaced alternately within the scope of the invention. For example, in the embodiments to be described below, the invention is applied to a projection optical system 530 of an exposure apparatus 500, the invention may be applied to an illumination optical system 514 of the exposure apparatus 500 or to any other optical system well-known in the art. In the drawings, the same reference numerals are assigned to corresponding elements, and duplicate description therefor will be omitted. FIG. 1 is a schematic and side view of a mirror holding method 100 according to an aspect of the present invention.

Denoted at 110 is a mirror for imaging light on the basis of reflection. The mirror 110 has a reflection surface on which a multilayered film for reflecting light is provided, such that light is strengthened by the multilayered film. A multilayered film that can be applied to the mirror 110 may be Mo/Si multilayered film wherein molybdenum (Mo) layers and silicon (Si) layers are accumulated alternately or Mo/Be multilayered film wherein Mo layers and beryllium (Be) layers are accumulated alternately. However, the multilayered film is not limited to these materials, and any other multilayered films having similar functions and effects may be used.

Denoted at 112 are recessed portions which are distributed at 120-degree pitch along the same circumference. However, the recessed portions may not be provided at 120-degree pitch, but they may be disposed in an angular range from not less than 90 deg. to not greater than 160 deg, more preferably, 110 deg. to 130 deg. This will be described in greater detail, with reference to FIG. 2.

Figure 2:
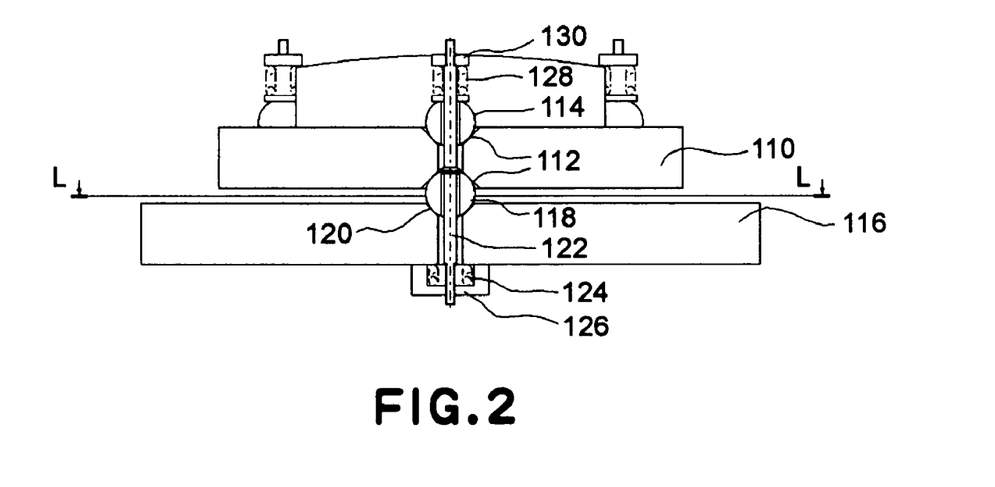
FIG. 2 is a sectional view taken along a plane A—A in FIG. 11.

FIG. 2 is a sectional view taken along a plane A—A in FIG. 1. The recessed portions 112 are formed to be opposed to both sides of a flange surface of the mirror, and they have a conical shape. The recessed portion may be formed directly on the mirror, or it may be provided on a member that is formed integrally with the mirror. Alternatively, it may be formed on a member that supports the mirror in the counter-gravity direction.

Denoted at 114 are spherical members. Each spherical member 114 has a shape of perfect sphericity, and it engages with the slant surface of the recessed portion 112 by linear contact, by which it is held. Here, by combination of a spherical member and a recessed portion of conical shape, substantial linear contact is assured. However, the recessed portion may be formed with a shape of triangular pyramid to assure three-point contact. Other forms will be described below.

Denoted at 116 is a support table. The support table 116 has spherical members 118 (to be described below) which are in contact with the mirror 110, and grooves 120 for receiving the spherical members 118. It supports the mirror 110. The supporting table 116 is a ring-like plate member disposed about the optical axis, and it is desirable that the table 116 is made of a material having substantially the same or corresponding linear expansion coefficient as that of the mirror 110.

The spherical members 118 are disposed at 120-deg. pitch to meet the recessed portions 112 formed at the lower portion of the flange (intermediate support member) of the mirror 110. Since the spherical members 118 are distributed substantially equidistantly along a circumferential direction of the mirror 110, the mirror 110 can be stable on the support member 116. As a matter of course, since this is just to keep a desired mirror shape, any other pitch, other than 120 deg. pitch, may be used provided that the desired mirror shape can be maintained. Here, the spherical member 118 is a member at least of which has a shape of perfect sphericity, and the outer circumference of it engages with the recessed portion 112 formed at the lower portion of the flange of the mirror 110. In this example, the recessed portion 112 has a conic shape, but it may have a shape of pyramid with angular corners of a number n (n is an integer not less than 3), such as triangular pyramid or square pyramid, for example. Alternatively, it may be a recessed portion having a similar side face or faces like that of a cone or pyramid, for example, truncated cone or truncated pyramid. Where a recessed portion of pyramid shape is used, the portion to be engaged with a spherical member should have a shape similar to the side face of the pyramid and, additionally, the spherical member and the recessed portion should engage at three points or more.

Here, the cone or pyramid described above may be provided in a portion outside the effective region of the mirror (optical element). Alternatively, it may be provided a support member (supporting frame) that is formed integrally with the mirror or that has a substantially fixed relative position with respect to the mirror. As a further alternative, it may be provided on a supporting member (supporting frame) that supports the mirror at plural point (three points, for example). Here, the member on which such cone or pyramid is formed will be referred to as an "intermediate support member".

The spherical member 118 is mounted on a groove 120 which is movable in a radial direction of the support table 116. Namely, the groove 120 has a freedom in the radial direction. Here, in order to assure engagement of the spherical member 118 with the recessed portion 112, the recessed portion may be "co-rubbed" with use of the spherical member 118. Here, "co-rubbing" is to assure substantial linear contact between the spherical member and the recessed portion (conic shape).

The grooves 120 are formed on the support table 116 at 120-deg. pitch, in radial directions. The disposition of the grooves 120 corresponds to the recessed portions 112. The groove 120 functions to allow motion of the spherical member 118 in the radial direction but to restrict motion thereof in the circumferential direction. It has a sectional shape of V-shape, so that the spherical member 118 engages with flat faces of the groove at two points. Namely, by means of three grooves 118, the mirror 110 is supported at six points with the spherical members 118 (i.e. kinematic support). Thus, without excessive confinement to the mirror 110, the posture of the mirror can be maintained.

Now, the structure of the supporting table 116 will be described in detail, with reference to FIG. 3.

Figure 3:
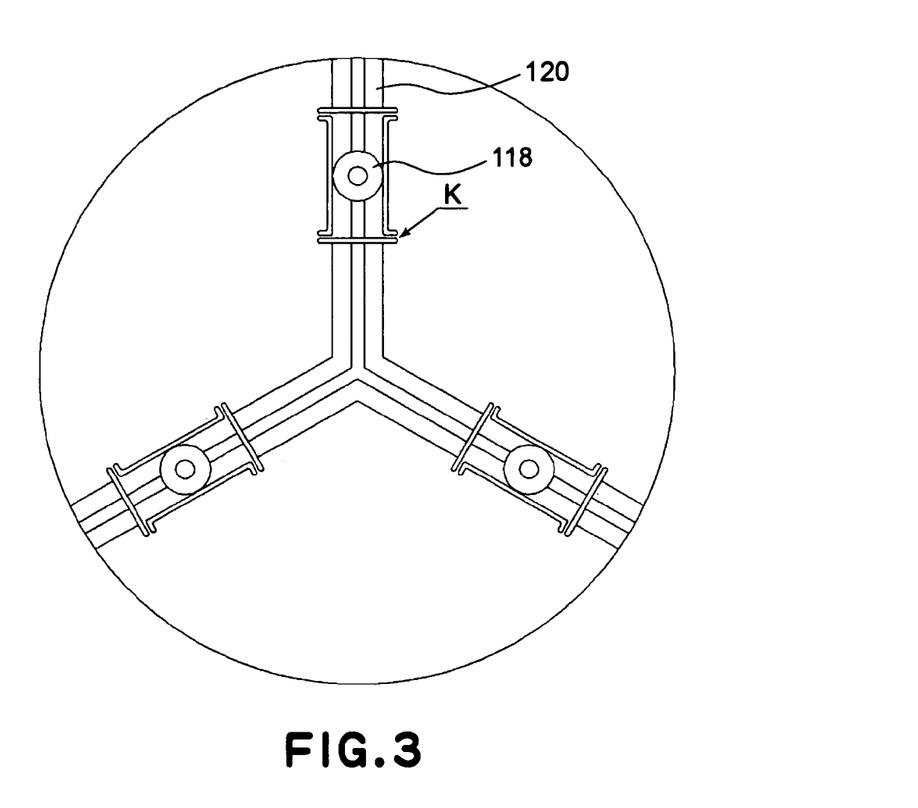
FIG. 3 is a sectional view taken along a plane L—L and as seen from the above.

FIG. 3 is a sectional view taken along a plane L—L in FIG. 2 and as seen from the above. As has been already described above, the support table 116 has grooves 120 provided at 120-deg. pitch about a predetermined point and in approximately radial directions. Here, the grooves 120 may not be provided at 120-deg. pitch as like the recessed portions. The grooves may be formed with a mutual angle relation of not less than 90 deg. and not greater than 160 deg., more preferably, not less than 110 deg. and not greater than 130 deg.

Around the groove, there are notches formed perpendicularly to and in parallel to the groove 120 so as to sandwich, therebetween, the two contact points for supporting the spherical member 118, and an elastic hinge K is provided there. With this structure, even if there occurs thermal expansion of the mirror 110 in response to changes in temperature environment, the elastic hinge K links in parallel so that expansion in the radial direction is allowed. This effectively prevents positional deviation of the mirror center with respect to the optical axis.

As regards the spherical member 118 and the groove 120, in order to avoid a change in posture of the mirror 110 resulting from deformation at the two contact points and also to assure idealistic six-point contact, they should have high stiffness and the friction should be reduced as much as possible (low friction coefficient). As regards the materials for the spherical members 118 and grooves 120 that satisfy high stiffness and low friction coefficient, ceramics, metal having a surface subjected to hardening heat treatment, or film coating based on ion plating such as DLC, for example, may be used.

Referring back to FIG. 2, denoted at 112 is a connecting rod that functions to secure the spherical members 114 and 118 to the mirror 110 and to connect the spherical member 118 to the support table 116. In this example, the spherical member 118 has an integral structure with the connecting rod 122.

Denoted at 124 is a pressing spring, and denoted at 126 is a nut for the pressing spring. By using these two parts, the spherical member 118 is pressed against the support table 116, whereby a large rigidity is assured. However, the structure is not limited to this. In place of using a spring, a structure for attracting the connecting rod 122 may be used, with similar advantageous effects. Further, in place of the connecting rod 122, a string or wire may be used to provide similar functions.

In the structure shown in FIG. 2, described above, if the structure is produced idealistically, the mirror can be stably held on the support table 116. If however there is a manufacturing error or assembling error, the connecting rod 122 may tilt and thus a moment load may be applied to the mirror 110 through the spherical member 118. In order to avoid it, the following method may be used.

Figure 4:
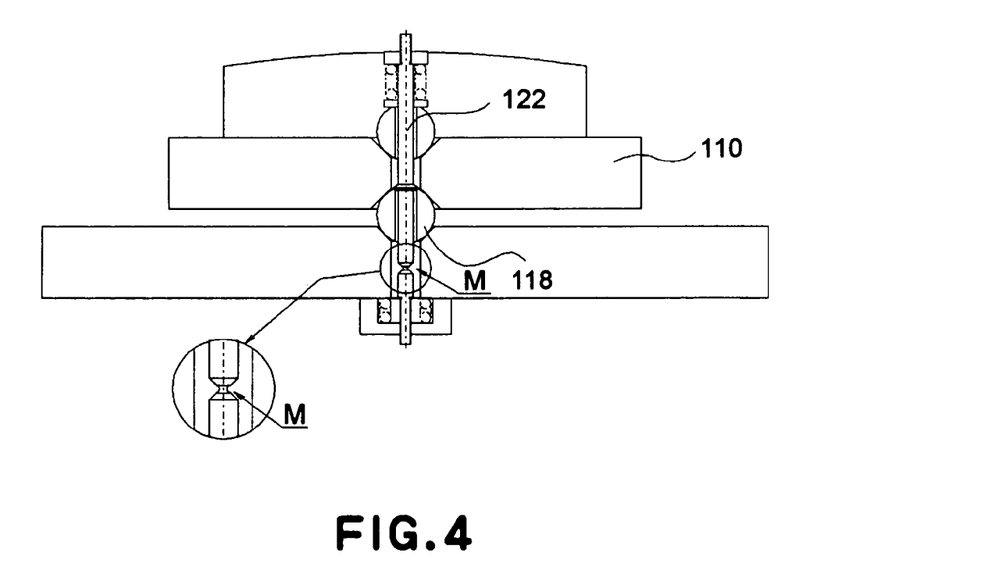
FIG. 4 is a sectional view for explaining a coupling rod with an elastic hinge.

FIG. 4 shows an example wherein the connecting rod 122 is provided with an elastic hinge. In the drawing, the central portion of the connecting rod is thinned to provide a flexible hinge M there. With this arrangement, even if a moment load is applied to the mirror 110, such load can be absorbed by the hinge M. Thus, idealistic support is assured.

Only by the self weight thereof, the mirror 110 can be stable upon the support member 116 through cooperation of the spherical members 118 and grooves 120. However, while taking into account the possibility of vibration to be applied during transportation of the optical system having the holding system 100 incorporated therein, in this example, a pressing spring 128 and a nut 130 for the pressing spring are used to press the spherical member 114 against the mirror 110, thereby to increase the rigidity.

Figure 5:
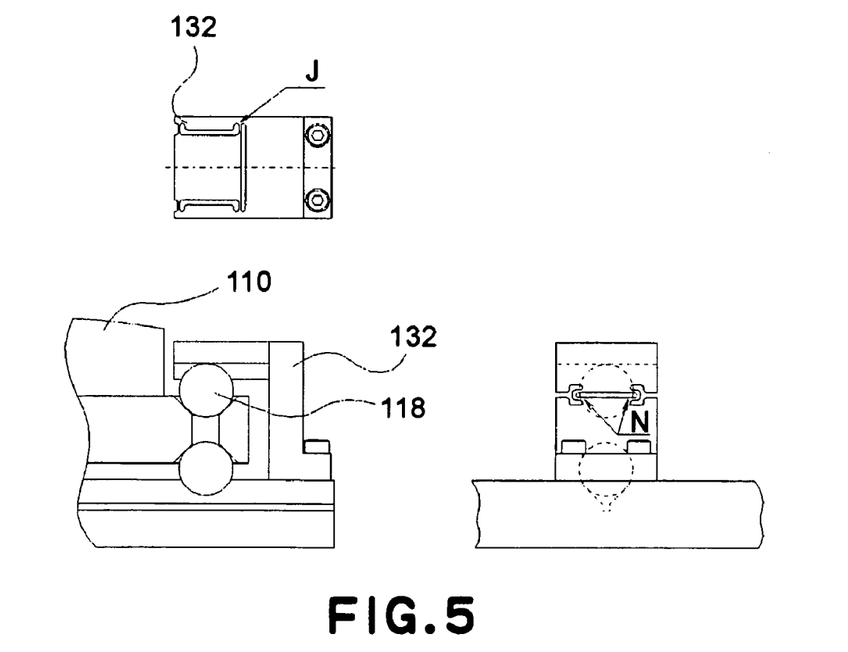
FIG. 5 is a schematic view for explaining an example of improving vibration resistive rigidity.

The rigidity improvement is not limited to this structure. FIG. 5 shows an example of increasing the vibration rigidity. Denoted at 132 is an elastic support member having two flexible hinges. In the top plan view in FIG. 5, the flexible hinge is denoted at J, and functions like the flexible hinge K described hereinbefore. Since the flexible hinge J is provided to define a parallel linkage, even if thermal expansion of the mirror occurs in response to a change in temperature environment, expansion thereof in the radial direction is allowed. This effectively prevents a positional deviation of the mirror center with respect to the optical axis.

In the side view in FIG. 5, there is a flexible hinge N that allows shift in the optical axis direction in response to a change in temperature environment. Also, it enables absorption of vibration applied from the outside. At the engagement between the elastic support member 132 and the spherical member 114, they engage with each other by point contact. For idealistic contact, they have a large stiffness and the friction should be reduced as much as possible. As regards the materials that satisfy high stiffness and low friction coefficient, ceramics, metal having a surface subjected to hardening heat treatment, or film coating based on ion plating such as DLC, for example, may be used.

The elastic support member 132 may function to continuously or normally clamp the mirror 110. Depending on the required mirror surface precision or vibration resisting characteristics, whether it should be used continuously or used only for transportation may be determined appropriately.

Figure 6:
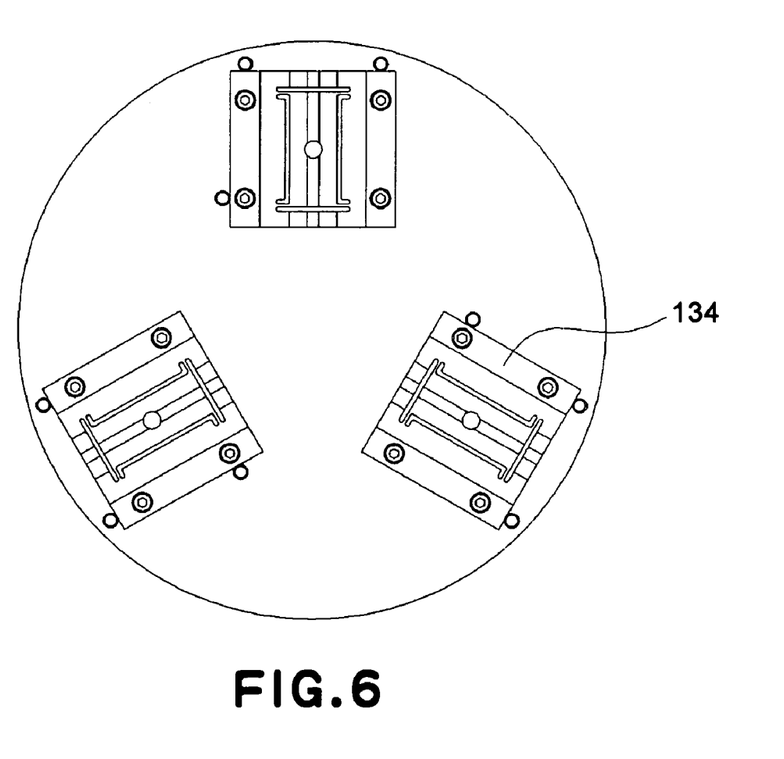
FIG. 6 is a schematic view for explaining an example wherein grooves and elastic hinges are formed in separate structures.

With the structure described above, the mirror 110 can be supported on the support table 116 without surface deformation regardless of thermal expansion thereof. Here, it should be noted that, although in the foregoing embodiments the grooves and elastic hinges are provided on the support table 116, these portions may be formed as a separate structure, and substantially the same advantageous effects are obtainable thereby. FIG. 6 shows it, and illustrates an example wherein the grooves and elastic hinges are provided in a separate structure. Denoted at 134 are groove members that embody the structure described above. By providing them in a similar structure like the support table 116, substantially the same advantageous effects are obtainable. The material and surface treatment described hereinbefore similarly apply to the groove members 134, and duplicate description will be omitted here.

The foregoing embodiments have been described with reference to a mirror as an optical element. However, it may be any other optical element such as lens, parallel planar plate, diffractive optical element, or polarizing plate, for example.

In the foregoing embodiments, the grooves provided on the support table 116 are made movable in the radial directions. However, as a matter of course, the recessed portions may be made movable in the radial directions, with similar advantageous effects. As a further alternative, the recessed portions may be formed on the support table, while the grooves may be formed on the mirror (optical element).

In the embodiments described above, desirably, the grooves and support table are made relatively movable in a direction perpendicular to the optical axis of the mirror (optical element). Preferably, the movement direction may be the same as an approximately radial direction about the optical axis of the mirror (optical element). As a specific structure, preferably, the groove (or recessed portion) and the support table (or mirror) may be connected through a member (such as a leaf spring, for example) that can be easily deformed with respect to a predetermined direction perpendicular to the optical axis of the mirror (optical element) (preferably, in an approximately radial direction about the mirror optical axis) but can not be easily deformed with respect to a direction parallel to the mirror optical axis. As a matter of course, the structure may be that the recess (or groove) and the mirror (optical element) may be connected to each other through such a member. Here, as regards the aforementioned movement direction, it may be in an approximately radial direction about a predetermined point inside an effective region of light impinging on the mirror, but not in the approximately radial direction about the optical axis of the mirror (optical element). More preferably, it may be in an approximately radial direction about a predetermined point adjacent the gravity center position of the effective region of the light incident on the mirror.

Figure 7:
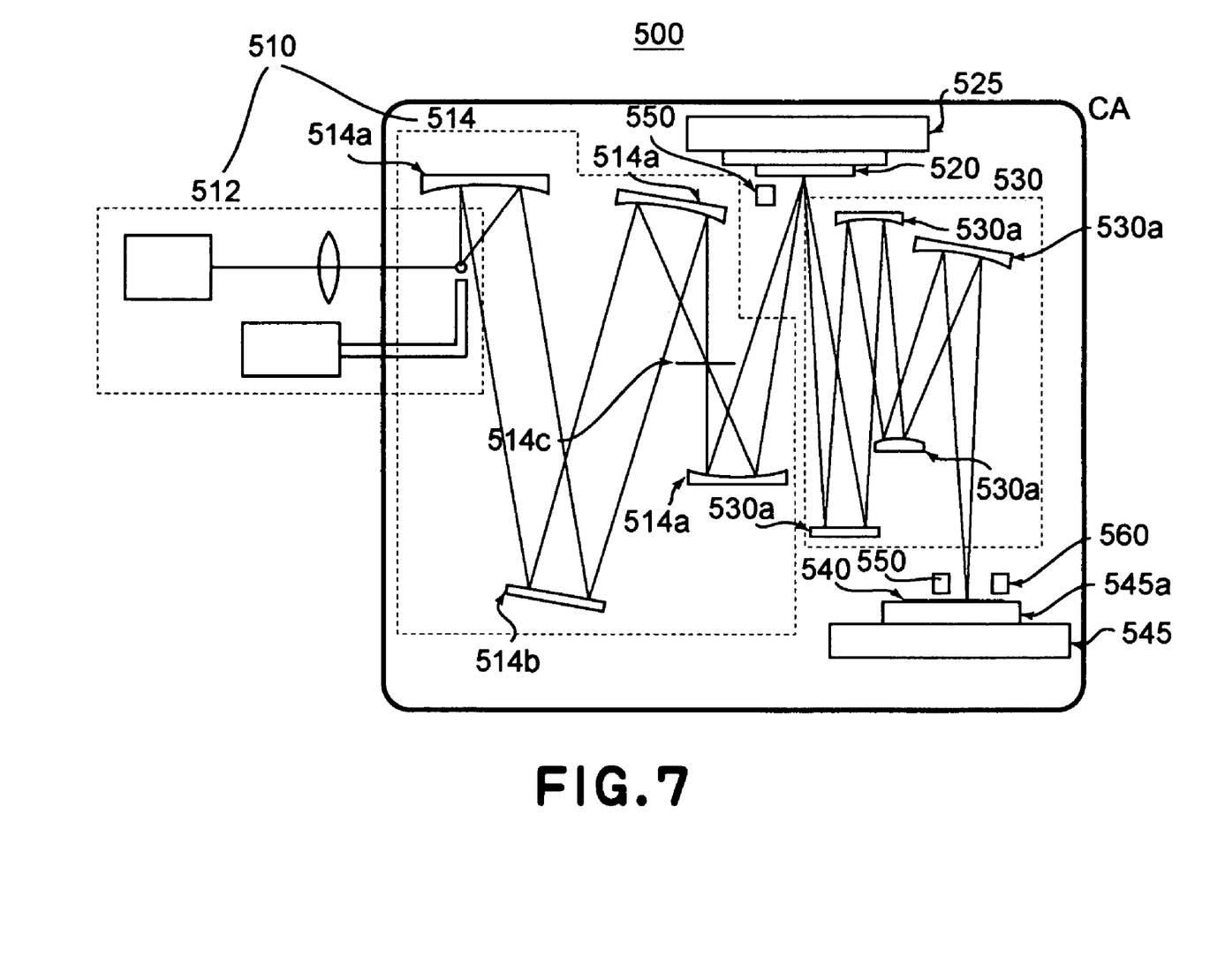
FIG. 7 is a schematic view of a general structure of an exposure apparatus according to an embodiment of the present invention.

Referring now to FIG. 7, an embodiment of exposure apparatus 500 according to the present invention will be described. FIG. 7 is a schematic view of a general structure of the exposure apparatus 500.

The exposure apparatus 500 is a projection exposure apparatus wherein EUV light (e.g. wavelength 13.4 nm) is used as illumination light for exposure, and a circuit pattern formed on a mask 520 is projected and lithographically transferred to a workpiece 540 to be exposed, in accordance with a step-and scan method or step-and-repeat method, for example. This type of exposure apparatus is particularly suitably usable to lithographic process for submicron or quarter-micron order. In this embodiment, description will be made to an example of step-and-scan type exposure apparatus, called a scanner. Here, the step-and-scan method is an exposure method in which a wafer is continuously scanned (scanningly moved) relative to a mask so that a mask pattern is lithographically transferred to the wafer while, on the other hand, after completion of the exposure of one shot, the wafer is moved stepwise for exposure of a subsequent exposure region. On the other hand, the step-and-repeat method is an exposure method in which, each time a zone exposure is completed, the wafer is moved stepwise toward a subsequent exposure region.

Referring to FIG. 7, the exposure apparatus 500 comprises an illumination system 510, a mask 520, a mask stage 525 for carrying the mask 520 thereon, a projection optical system 530, a workpiece 540 to be exposed, a wafer stage 545 for carrying the workpiece 540 thereon, an alignment detecting mechanism 550, and a focus position detecting mechanism 560.

As shown in FIG. 7, since EUV light has low transmissivity to atmosphere, at least the light path along which the EUV light passes (that is, the whole optical system) may preferably be filled with a vacuum ambience VC.

The illumination system 510 is arranged to illuminate a mask 520 with EUV light (e.g. wavelength 13.4 nm) of arcuate shape defined with respect to an arcuate view field of the projection optical system 530. It includes an EUV light source 512 and an illumination optical system 514.

The EUV light source 512 comprises a laser plasma light source, for example. In the laser plasma light source, pulsed laser light of large intensity is projected on a target material placed inside a vacuum container, whereby a high-temperature plasma is produced. EUV light of a wavelength of 13 nm order, for example, emitted from the plasma is used. As regards the target material, metal film, gas jet or liquid drops may be used. In order to improve the average intensity of emitted EUV light, the repetition frequency of the pulse laser should be high, and generally, the laser is operated at a repetition frequency of a few KHz.

The illumination optical system 514 comprises a condensing mirror 514a and an optical integrator 514b. The condensing mirror 514a serves to collect EUV light being approximately isotropically emitted from the laser plasma. The optical integrator 514b has a function for illuminating the mask 520 uniformly with a predetermined numerical aperture. Also, the illumination optical system 514 includes an aperture 514c disposed at a position optically conjugate with the mask 520, for restricting the illumination region on the mask into an arcuate shape. The holding system 100 of the present invention can be applied to the condensing mirror 514a and the optical integrator 514b which are optical members constituting the illumination optical system 514.

The mask 520 is a reflection type mask, and it has a circuit pattern (or image) formed thereon which pattern is going to be transferred. The mask is supported on and moved by a mask stage 525. Diffraction light produced from the mask 520 as illuminated is reflected by the projection optical system 530, and is projected on the workpiece 540 to be exposed. The mask 520 and the workpiece 540 are disposed in an optically conjugate relationship with each other. The exposure apparatus 500 in this embodiment is a step-and-scan type exposure apparatus, and by scanning the mask 520 and the workpiece 540, the pattern of the mask 520 is projected and transferred onto the workpiece 540 in a reduced scale.

The mask stage 525 supports the mask 520, and it is connected to a moving mechanism (not shown). Any structure well-known in the art may be applied to the mask stage 525. The moving mechanism not shown in the drawing comprises a linear motor, for example, and it drives the mask stage 525 at least in X direction, thereby to move the mask 520. The exposure apparatus 500 operates to scan the mask 520 and the workpiece 540 in synchronism with each other.

Here, the scan direction along the plane of the mask 520 surface or workpiece 540 surface will be referred to as X, a direction perpendicular to that direction will be referred to as Y, and a direction perpendicular to the mask 520 surface or workpiece 540 surface will be referred to as Z.

The projection optical system 530 includes a plurality of reflection mirrors (multilayered-film mirrors) 530a to project a pattern formed on the mask 520 surface onto the workpiece 540 (image plane) in a reduced scale. The number of mirrors 530a may be about four to six. In order to obtain a wide exposure region with a smaller number of mirrors, only a narrow arcuate region (ring field) spaced from the optical axis by a certain distance, may be used, while the mask 520 and the workpiece 540 are scanned simultaneously. This enables transfer of a wide area.

The numerical aperture (NA) of the projection optical system is about 0.1 to 0.3. The holding system 100 of the present invention can be applied to the mirrors 530a, for example, which are optical members that constitute the projection optical system 530. The holding system 100 is connected to a barrel of the projection optical system 530 through a member, not shown. Thus, the in the projection optical system 530, aberrations due to deformation and positional deviation of an optical member, which would cause degradation of the imaging performance, can be reduced effectively and a desired optical performance can be accomplished.

The workpiece 540 is a wafer, in this embodiment. However, it may be a liquid crystal base substrate or any other members to be processed. The workpiece 540 has a photoresist applied thereto.

The photoresist application step includes a pre-process, an adhesion enhancing agent applying process, a photoresist applying process, and a pre-baking process. The pre-process includes washing and drying. The adhesion enhancing agent applying process is a surface improving process (hydrophobic process based on application of a surface active agent) for improving the adhesion between the photoresist and the substrate. An organic film such as HMDS (hexamethyldisilazane) may be applied by coating or vapor deposition. The pre-baking is a baking (sintering) process, but it is mild as compared with that to be carried out after the development. This process is to remove the solvent.

The wafer stage 545 has a wafer chuck 545a to support the workpiece 540. The wafer stage 545 moves the workpiece in X, Y and Z directions by use of a linear motor, for example. The mask 520 and the workpiece 540 are scanned (moved) in synchronism with each other. Also, the position of the mask stage 535 and the position of the wafer stage 545 are monitored by means of a laser interferometer, for example, and they are driven at a constant speed ratio.

The alignment detecting mechanism 550 has a function for measuring the positional relation between the mask 520 position and the optical axis of the projection optical system 530, as well as the positional relation between the workpiece 540 position and the optical axis of the projection optical system 530. Also, it functions to set the positions and angles of the mask stage 525 and the wafer stage 545 so that a projected image of the mask 520 is registered with a predetermined position of the workpiece 540.

The focus position detecting mechanism 560 measures the focus position upon the workpiece 540 surface, and it controls the position and angle of the wafer stage 545 thereby to continuously hold the workpiece 540 surface at the imaging position of the projection optical system 530.

In exposure operation, the EUV light produced by the illumination device 510 illuminates the mask 520, and the pattern provided on the mask 520 surface is imaged upon the workpiece 540 surface. In this embodiment, the image plane has an arcuate shape (ring-like shape) and, by scanning the mask 520 and the workpiece 540 at a speed ratio corresponding to the reduction magnification ratio, the whole surface of the mask 520 is exposed.

Next, referring to FIGS. 8 and 9, an embodiment of a device manufacturing method which uses an exposure apparatus 500 described above, will be explained.

Figure 8:
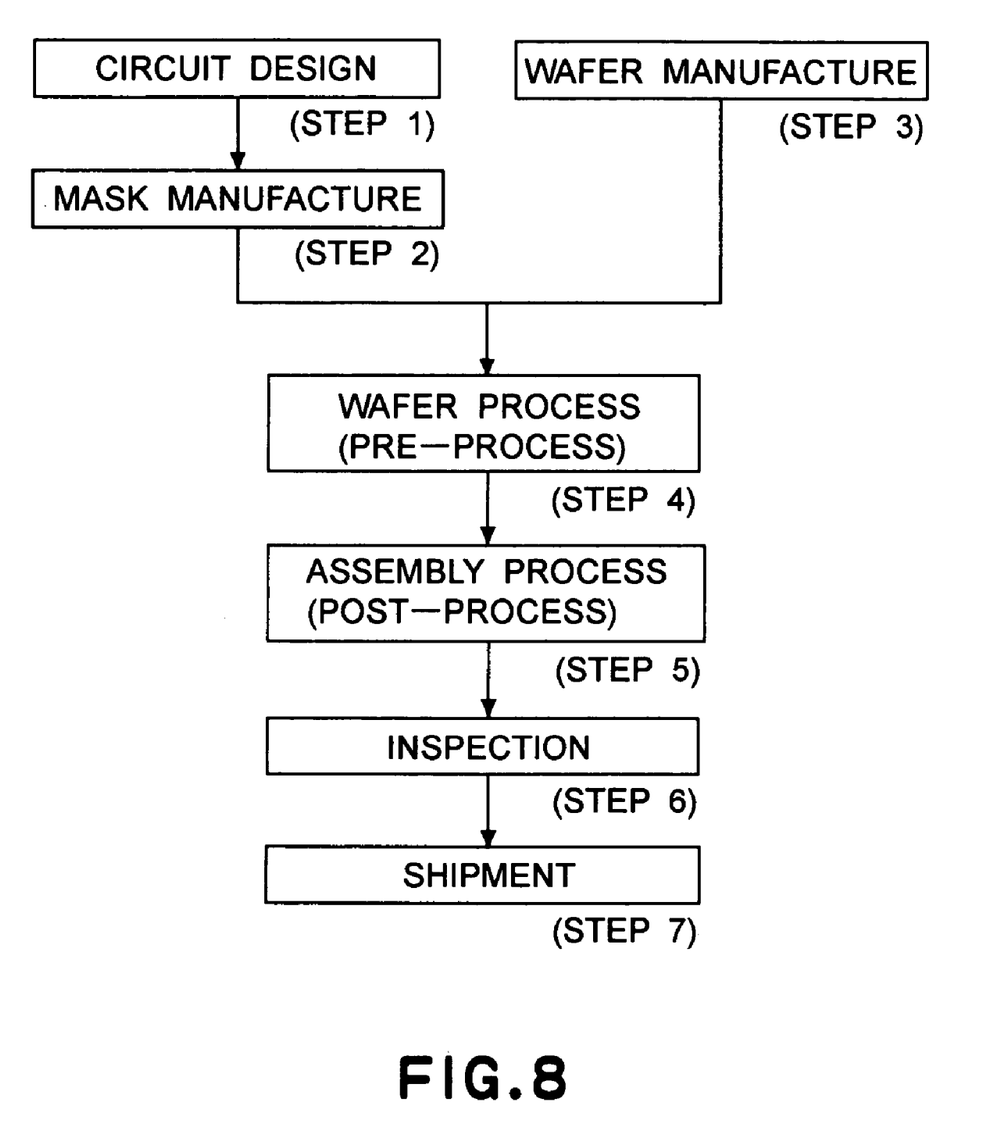
FIG. 8 is a flow chart for explaining manufacturing procedure for microdevices such as semiconductor chips (IC or LSI), LCD, or CCD, for example.

FIG. 8 is a flow chart for explaining the procedure of manufacturing various microdevices such as semiconductor chips (e.g., ICs or LSIs), liquid crystal panels, or CCDs, for example. In this embodiment, description will be made to an example of semiconductor chip production. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the thus prepared mask and wafer, a circuit is formed on the wafer in practice, in accordance with lithography. Step 5 subsequent to this is an assembling step which is called a post-process wherein the wafer having been processed at step 4 is formed into semiconductor chips. This step includes an assembling (dicing and bonding) process and a packaging (chip sealing) process. Step 6 is an inspection step wherein an operation check, a durability check an so on, for the semiconductor devices produced by step 5, are carried out. With these processes, semiconductor devices are produced, and they are shipped (step 7).

Figure 9:
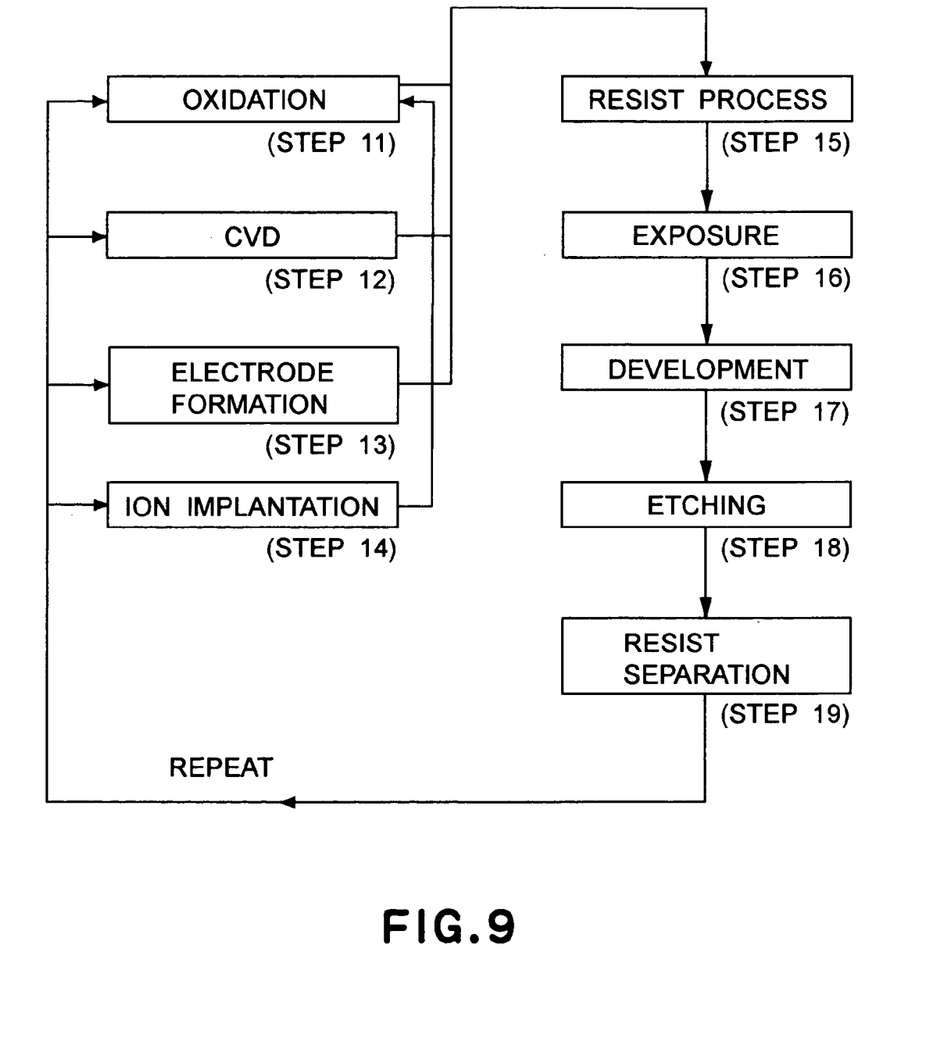
FIG. 9 is a flow chart for explaining details of a wafer process at step 4 in FIG. 8.

FIG. 9 is a flow chart for explaining details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high-quality microdevices can be manufactured.

As described, a device manufacturing method that uses an exposure apparatus as well as a device as a product thereof are also in the scope of the present invention.

While preferred embodiments of the present invention have been described in the foregoing, the invention is not limited to them. Many changes and various modifications are possible within the scope of the invention. As an example, the holding system of the present invention may be used to support a mask or a wafer.

While the invention has been described with reference to the structures disclosed herein, it is not confined to the details set forth and this application is intended to cover such modifications or changes as may come within the purposes of the improvements or the scope of the following claims.

What is claimed is:

1. A holding system, comprising:
   a supporting member for supporting an optical element approximately at six points through three first spherical members,
   wherein said supporting member has three grooves each extending in an approximately radial direction about a predetermined point,
   wherein the three grooves and the three first spherical members are engaged with each other to position the optical element, and
   wherein each of the three grooves is movable in the approximately radial direction.

2. A holding system according to claim 1, wherein the three grooves are coupled to a fixing member through an elastic member, and wherein, through elastic deformation of the elastic member in the approximately radial direction, the three grooves can move.

3. A holding system according to claim 2, wherein the elastic member is a resilient hinge.

4. A holding system according to claim 2, wherein the elastic member is a leaf spring, and wherein a direction normal to the surface of the leaf spring is substantially parallel to the approximately radial direction.

5. A holding system according to claim 2, wherein elastic deformation of the elastic member can occur substantially only in the approximately radial direction.

6. A holding system according to claim 2, further comprising an elastic supporting member for applying an elastic force to the optical element in a direction pressing the optical element against the first spherical member, wherein the elastic supporting member is fixed to the fixing member.

7. A holding system according to claim 6, wherein the portion of the elastic supporting member that applies a force in a direction pressing the optical element against the first spherical member, is movable in the approximately radial direction.

8. A holding system according to claim 6, wherein the elastic supporting member applies a force to the optical element through a second spherical member.

9. A holding system according to claim 8, wherein the elastic supporting member and the second spherical member engage with each other substantially at a single point.

10. A holding system according to claim 1, further comprising an elastic supporting member for applying an elastic force to the optical element in a direction pressing the optical element against the first spherical member.

11. A holding system according to claim 1, further comprising an intermediate supporting member being provided integrally with the optical element or being arranged to support the optical element, wherein the intermediate supporting member has three first recessed portions, the three first recessed portions and the three first spherical members engage with each other at three or more points, or they engage with each other linearly, and wherein, at contact points between the three first recessed portions and the three first spherical members, the first recessed portions have a side-face shape of pyramid or cone.

12. A holding system according to claim 11, wherein the first recessed portions have a shape of one cone, pyramid, truncated cone and truncated pyramid.

13. A holding system according to claim 11, further comprising a second intermediate supporting member being provided integrally with the optical element or being provided on the optical element or being arranged to support the optical element, said second intermediate supporting member having three second recessed portions and three second spherical members corresponding to the three second recessed portions, respectively, wherein each of the second recessed portions engages with a second spherical member at three or more points or they engage with each other substantially linearly, and wherein a force that the second spherical member applies to the second recessed portion and a force that the first spherical member applies to the second recessed portion are substantially in opposite directions.

14. A holding system according to claim 11, wherein the intermediate supporting member is provided by a portion of the optical element.

15. A holding system according to claim 11, wherein the intermediate supporting member is a supporting frame, a relative position of which with reference to the optical element is substantially unchangeable.

16. A holding system according to claim 1, further comprising a coupling member for connecting the optical element and the supporting member through the spherical member.

17. A holding system according to claim 16, wherein the coupling member is a resilient hinge.

18. A holding system according to claim 1, wherein the three grooves are disposed to define, therebetween, an angle not less than 90 deg. and not greater than 160 deg.

19. A holding system according to claim 1, wherein the three grooves are disposed to define, therebetween, an angle not less than 110 deg. and not greater than 130 deg.

20. A holding system according to claim 1, wherein the three grooves have a V-shape in cross-section, contacting the three first spherical members approximately at two points.

21. A holding system according to claim 1, wherein the optical element is a reflection member.

22. An exposure apparatus, comprising:
an illumination optical system for illuminating a pattern, formed on a mask or a reticle, with light from a light source;
a projection optical system for projecting light from the pattern to a workpiece to be exposed; and
a holding system as recited in claim 1,
wherein at least one of said illumination optical system and said projection optical system includes said holding system.

23. An apparatus according to claim 22, wherein light used in said apparatus is extreme ultraviolet light.

24. An apparatus according to claim 22, wherein, in said exposure apparatus, an ambience of a light path along which exposure light passes is filled with a high vacuum or substantially filled with a helium gas.

25. A device manufacturing method, comprising the steps of:
exposing a workpiece to be exposed, by use of an exposure apparatus as recited in claim 22; and
performing a predetermined process to the exposed workpiece.

* * * * *